United States Patent
Haran et al.

(10) Patent No.: US 8,432,002 B2
(45) Date of Patent: Apr. 30, 2013

(54) METHOD AND STRUCTURE FOR LOW RESISTIVE SOURCE AND DRAIN REGIONS IN A REPLACEMENT METAL GATE PROCESS FLOW

(75) Inventors: Balasubramanian S. Haran, Watervliet, NY (US); Kangguo Cheng, Guilderland, NY (US); Shom Ponoth, Clifton Park, NY (US); Theodorus E. Standaert, Clifton Park, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/170,565

(22) Filed: Jun. 28, 2011

(65) Prior Publication Data

US 2013/0001706 A1    Jan. 3, 2013

(51) Int. Cl.
*H01L 29/72* (2006.01)
(52) U.S. Cl.
USPC ............... 257/388; 257/412; 257/E29.158
(58) Field of Classification Search .......... 257/388, 257/412, E29.158
See application file for complete search history.

(56) References Cited

U.S. PATENT DOCUMENTS

| | | | |
|---|---|---|---|
| 7,023,055 B2 * | 4/2006 | Ieong et al. | 257/369 |
| 7,271,455 B2 * | 9/2007 | Cabral et al. | 257/382 |
| 7,329,923 B2 * | 2/2008 | Doris et al. | 257/347 |
| 7,705,405 B2 * | 4/2010 | Biery et al. | 257/388 |
| 7,892,911 B2 * | 2/2011 | Wood et al. | 438/206 |
| 7,902,599 B2 * | 3/2011 | Carter et al. | 257/334 |
| 7,977,751 B2 * | 7/2011 | Nagaoka et al. | 257/365 |
| 8,148,786 B2 * | 4/2012 | Kavalieros et al. | 257/401 |
| 2005/0116290 A1 * | 6/2005 | de Souza et al. | 257/347 |
| 2006/0091432 A1 * | 5/2006 | Guha et al. | 257/288 |
| 2006/0286729 A1 * | 12/2006 | Kavalieros et al. | 438/183 |
| 2011/0062526 A1 * | 3/2011 | Xu et al. | 257/369 |
| 2011/0140207 A1 * | 6/2011 | Lin et al. | 257/412 |
| 2011/0147858 A1 * | 6/2011 | Lim et al. | 257/412 |

* cited by examiner

*Primary Examiner* — Julio J Maldonado
*Assistant Examiner* — Jaehwan Oh
(74) *Attorney, Agent, or Firm* — Scully, Scott, Murphy & Presser, P.C.; H. Daniel Schnurmann

(57) ABSTRACT

In one embodiment a method is provided that includes providing a structure including a semiconductor substrate having at least one device region located therein, and a doped semiconductor layer located on an upper surface of the semiconductor substrate in the at least one device region. After providing the structure, a sacrificial gate region having a spacer located on sidewalls thereof is formed on an upper surface of the doped semiconductor layer. A planarizing dielectric material is then formed and the sacrificial gate region is removed to form an opening that exposes a portion of the doped semiconductor layer. The opening is extended to an upper surface of the semiconductor substrate and then an anneal is performed that causes outdiffusion of dopant from remaining portions of the doped semiconductor layer forming a source region and a drain region in portions of the semiconductor substrate that are located beneath the remaining portions of the doped semiconductor layer. A high k gate dielectric and a metal gate are then formed into the extended opening.

25 Claims, 5 Drawing Sheets

METHOD AND STRUCTURE FOR LOW RESISTIVE SOURCE AND DRAIN REGIONS IN A REPLACEMENT METAL GATE PROCESS FLOW

BACKGROUND

The present disclosure relates to a semiconductor structure and a method of fabricating the same. More particularly, the present disclosure relates to a semiconductor structure including at least one high k/metal gate transistor having a low resistive source region and drain region and a method of fabricating the same.

In the semiconductor industry, a gate stack including a high k gate dielectric (a gate dielectric having a dielectric constant of greater than 4.0, typically greater than 7.0) and a metal gate is one of the most promising options for continuing complementary metal oxide semiconductor (CMOS) scaling.

One of the process schemes for fabricating a high k/metal gate metal oxide semiconductor field effect transistor (MOSFET) is a replacement gate process. In a replacement gate process, a MOSFET can be fabricated using a sacrificial gate electrode. In such a process, the sacrificial gate electrode is formed first, then a source region and a drain region are formed at the footprint of the sacrificial gate electrode, and thereafter the sacrificial gate electrode is replaced by a gate stack including a high k gate dielectric and a metal gate. Since the gate stack including the high k gate dielectric and the metal gate is formed after high temperature processing steps, the replacement gate process has the advantage of minimal damage on the high k gate dielectric and the metal gate. Moreover, a wide range of metals can be selected for the gate conductor.

Continuous scaling of MOSFET devices requires very sharp source junctions and drain junctions. In conventional MOSFET processing, including the replacement gate processing scheme mentioned above, the source region and the drain region of the MOSFETs are formed by ion implantation, followed by an activation anneal. Such processing however leads to diffused source junctions and drain junctions which, in turn, degrade short-channel control. Also, the diffused source junctions and drain junctions increase the resistance of the source region and the drain region, respectively, and hence reduce device performance.

Furthermore, pitch scaling introduces challenges in block level patterning. Resist residues at tight pitches necessitate high energy source and drain implants which worsen the two issues mentioned above.

SUMMARY

The present disclosure provides a method and structure for forming replacement high k/metal gate devices that have low resistive source regions and drain regions, while avoiding pitch scaling issues.

In one embodiment, the method of the present disclosure includes providing a structure including a semiconductor substrate having at least one device region located therein, and a doped semiconductor layer located on an upper surface of the semiconductor substrate in the at least one device region. After providing the structure, a sacrificial gate region having a spacer located on sidewalls thereof is formed on an upper surface of the doped semiconductor layer. A planarizing dielectric material is then formed and the sacrificial gate region is removed to form an opening that exposes a portion of the doped semiconductor layer. The opening is extended to an upper surface of the semiconductor substrate and then an anneal is performed that causes outdiffusion of dopant from remaining portions of the doped semiconductor layer forming a source region and a drain region in portions of the semiconductor substrate that are located beneath the remaining portions of the doped semiconductor layer. A high k gate dielectric and a metal gate are then formed into the extended opening.

In another embodiment, the method of present disclosure includes providing a structure including a semiconductor substrate having at least one p-type device region and at least one n-type device region, a p-type doped semiconductor layer located on an upper surface of the semiconductor substrate in the at least one p-type device region, a semiconductor stack comprising, from bottom to top, an amorphous semiconductor layer and an n-type doped semiconductor layer in the at least one n-type device region, and an isolation region extending to a surface of the semiconductor substrate and separating the p-type doped semiconductor layer in the at least one p-type device region from the semiconductor material stack in the at least one n-type device region. After providing the structure, a sacrificial gate region having a spacer located on sidewalls thereof is formed on an upper surface of each of the p-type doped semiconductor layer and the n-type doped semiconductor layer. A planarizing dielectric material is then formed and the sacrificial gate region is removed from the at least one p-type device region and the at least one n-type device region to form an opening that exposes a portion of the p-type doped semiconductor layer and another opening that exposes a portion of the n-type doped semiconductor layer. Each opening is extended to an upper surface of the semiconductor substrate and then an anneal is performed that causes outdiffusion of dopant from remaining portions of the p-type doped semiconductor layer forming a source region and a drain region in portions of the semiconductor substrate that are located beneath the remaining portions of the p-type doped semiconductor layer and outdiffusion of dopant from remaining portions of the n-type doped semiconductor layer forming another source region and another drain region in portions of the semiconductor substrate that are located beneath the remaining portions of the n-type doped semiconductor layer. A high k gate dielectric and a metal gate are then formed into each of the extended openings.

In addition to providing methods of fabricating a semiconductor structure, the present disclosure also provides a semiconductor structure having low resistive source and drain regions. The structure of the present disclosure comprises a semiconductor substrate having a source region and a drain region that are separated by a channel located within at least one device region. A high k gate dielectric and a metal gate are located atop the channel. The high k gate dielectric is contiguously present on sidewall surfaces and a bottom surface of the metal gate. A raised source region is located atop the source region and a raised drain region is located atop the drain region. A spacer is located atop a portion of the raised source region and atop a portion of the raised drain region. The portion of the raised source region and the portion of the raised drain region underneath the spacer are laterally adjacent a vertical portion of the high k gate dielectric. A planarizing dielectric material is located atop the raised source region and the raised drain region. The planarizing dielectric material has an upper surface that is coplanar with an upper surface of the metal gate.

DETAILED DESCRIPTION

The present disclosure, which provides a semiconductor structure including at least one high k/metal gate transistor having low resistive source regions and drain regions and a method of fabricating the same, will now be described in greater detail by referring to the following discussion and drawings that accompany the present application. It is observed that the drawings of the present application are provided for illustrative proposes and, as such, the drawings are not drawn to scale.

In the following description, numerous specific details are set forth, such as particular structures, components, materials, dimensions, processing steps and techniques, in order to provide an understanding of some aspects of the present disclosure. However, it will be appreciated by one of ordinary skill in the art that the various embodiments of the disclosure may be practiced without these specific details. In other instances, well-known structures or processing steps have not been described in detail in order to avoid obscuring the various embodiments of the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The following embodiments of the present application describe and illustrate the formation of a complementary metal oxide semiconductor (CMOS) structure including at least one high k/metal gate structure in a p-type device region and at least one high k/metal gate structure in an n-type device region. Although the description that follows and the drawings illustrate such an embodiment, the method of the present disclosure, to be described in greater detail herein below, can also be used in forming only at least one high k/metal gate structure in a p-type device region or forming at least one high k/metal gate structure in an n-type device region.

Figure 1:
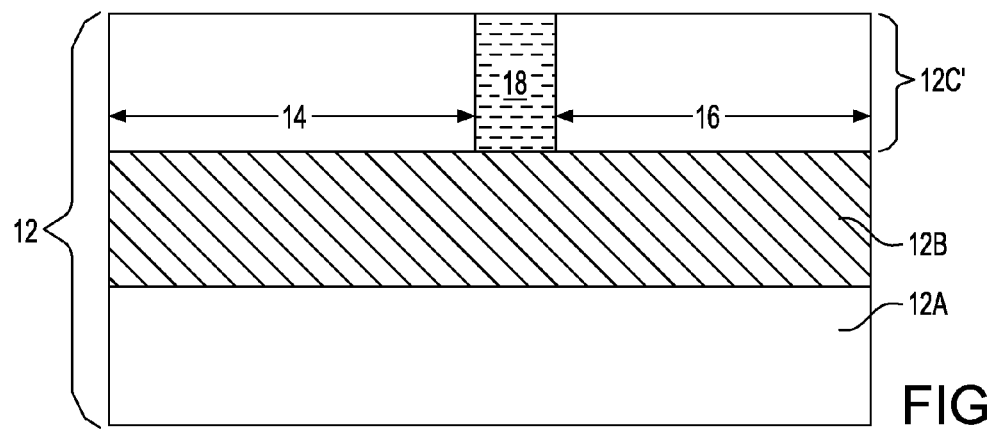
FIG. 1 is a pictorial representation (through a cross sectional view) illustrating an initial structure that can be employed in one embodiment of the present disclosure including a semiconductor substrate having at least one p-type device region and at least one n-type device region separated by an isolation region.

Reference is first made to FIG. 1, which illustrates an initial structure that can be employed in one embodiment of the present disclosure. As shown, the initial structure includes a semiconductor substrate 12 having at least one p-type device region 14 and at least one n-type device region 16 separated by an isolation region 18.

In some embodiments, a semiconductor-on-insulator (SOI) substrate can be employed as the semiconductor substrate 12. When employed, the SOI substrate includes a handle substrate 12A, a buried insulator layer 12B located on an upper surface of the handle substrate 12A, and a semiconductor device layer 12C located on an upper surface of the buried insulator layer 12B. The handle substrate 12A and the semiconductor device layer 12C of the SOI substrate may comprise the same, or different, semiconductor material. The term "semiconductor" as used herein in connection with the semiconductor material of the handle substrate 12A and the semiconductor device layer 12C denotes any semiconducting material including, for example, Si, Ge, SiGe, SiC, SiGeC, InAs, GaAs, InP or other like III/V compound semiconductors. Multilayers of these semiconductor materials can also be used as the semiconductor material of the handle substrate 12A and the semiconductor device layer 12C. In one embodiment, the handle substrate 12A and the semiconductor device layer 12C are both comprised of Si.

The handle substrate 12A and the semiconductor device layer 12C may have the same or different crystal orientation. For example, the crystal orientation of the handle substrate 12A and/or the semiconductor device layer 12C may be {100}, {110}, or {111}. Other crystallographic orientations besides those specifically mentioned can also be used in the present disclosure. The handle substrate 12A of the SOI substrate may be a single crystalline semiconductor material, a polycrystalline material, or an amorphous material. The semiconductor device layer 12C of the SOI substrate is a single crystalline semiconductor material. A single crystalline semiconductor material (or monocrystalline semiconductor material) is a semiconductor material in which the crystal lattice of the entire sample is continuous and unbroken to the edges of the sample, with no grain boundaries.

The buried insulator layer 12B of the SOI substrate may be a crystalline or non-crystalline oxide or nitride. In one embodiment, the buried insulator layer 12B is an oxide. The buried insulator layer 12B may be continuous or it may be discontinuous. When a discontinuous buried insulator region is present, the buried insulator region exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor layer to a layer having a thickness that is more desirable.

The thickness of the semiconductor device layer 12C of the SOI substrate is typically from 100 Å to 1000 Å, with a thickness from 500 Å to 700 Å being more typical. In some embodiments, and when an ETSOI (extremely thin semiconductor-on-insulator) substrate is employed, the semiconductor device layer 12C of the SOI has a thickness of less than 100 Å. If the thickness of the semiconductor device layer 12C is not within one of the above mentioned ranges, a thinning step such as, for example, planarization or etching can be used to reduce the thickness of the semiconductor device layer 12C to a value within one of the ranges mentioned above.

The buried insulator 12B of the SOI substrate typically has a thickness from 10 Å to 2000 Å, with a thickness from 1000 Å to 1500 Å being more typical. The thickness of the handle substrate 12A of the SOI substrate is inconsequential to the present disclosure.

In another embodiment, the semiconductor substrate 12 employed is a bulk single crystalline semiconductor substrate. When a bulk semiconductor substrate 12 is employed, a single crystalline semiconductor material contiguously extends from a topmost surface of semiconductor substrate 12 to a bottommost surface of semiconductor substrate 12.

In other embodiments, hybrid semiconductor substrates (not shown) which have different surface regions of different crystallographic orientations can be employed as semiconductor substrate 12. When a hybrid substrate is employed, an nFET is typically formed on a (100) crystal surface, while a pFET is typically formed on a (110) crystal plane. The hybrid substrate can be formed by techniques that are well known in the art. See, for example, U.S. Pat. No. 7,329,923, U.S. Publication No. 2005/0116290, dated Jun. 2, 2005 and U.S. Pat. No. 7,023,055, the entire contents of each are incorporated herein by reference.

The semiconductor substrate 12 may be doped, undoped or contain doped and undoped regions therein. For clarity, the doped regions are not specifically shown in the drawings of the present application. Each doped region within the semiconductor substrate 12 may have the same, or they may have different conductivities and/or doping concentrations. The doped regions that are present in the semiconductor substrate 12 are typically referred to as well regions and they are formed utilizing a conventional ion implantation process or gas phase doping.

The semiconductor substrate 12 can be processed at this point of the present disclosure to include at least one isolation region 18 therein. The at least one isolation region 18 can be a trench isolation region (as shown in the drawings of the present application) or a field oxide isolation region. The trench isolation region can be formed utilizing a conventional trench isolation process well known to those skilled in the art. For example, lithography, etching and filling of the trench with a trench dielectric such as an oxide may be used in forming the trench isolation region. Optionally, a liner may be formed in the trench prior to trench fill, a densification step may be performed after the trench fill and a planarization process may follow the trench fill as well. The field oxide isolation region may be formed utilizing a so-called local oxidation of silicon process. The at least one isolation region 18 provides isolation between neighboring gate regions, typically required when the neighboring gates have opposite conductivities, i.e., nFETs and pFETs. As such, the at least one isolation region 18 separates a p-FET device region (i.e., the at least one p-type device region 14) from an n-FET device region (i.e., the at least one n-type device region 16).

Figure 2:
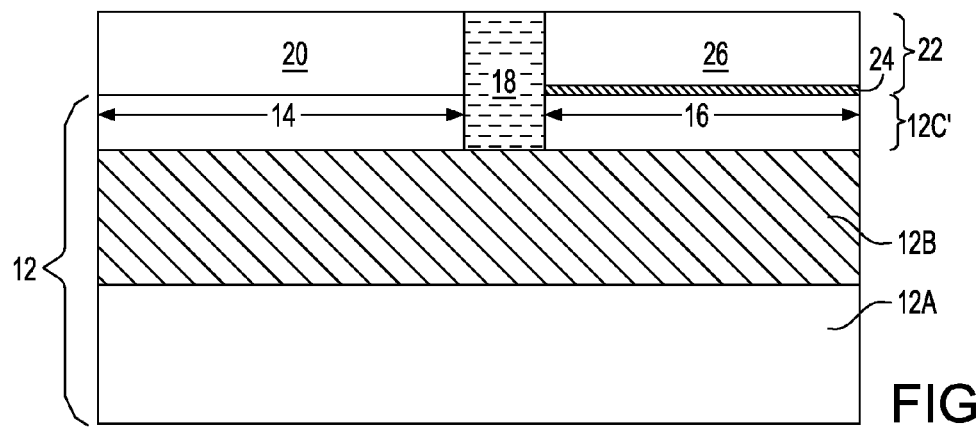
FIG. 2 is a pictorial representation (through a cross sectional view) illustrating the initial structure of FIG. 1 after recessing the semiconductor substrate in both device regions and forming a p-type doped semiconductor layer atop the recessed semiconductor substrate in the at least one p-type device region and forming a semiconductor material stack comprising, from bottom to top, an amorphous semiconductor layer and an n-type doped semiconductor layer atop the recessed semiconductor substrate in the at least one n-type device region.

Referring now to FIG. 2, there is illustrated the initial structure of FIG. 1 after recessing the semiconductor substrate 12 in both device regions (i.e., the at least one p-type device region 14 and the at least one p-type device region 16) and forming a p-type doped semiconductor layer 20 atop the recessed semiconductor substrate (i.e., recessed semiconductor device layer 12C') in the at least one p-type device region 14 and forming a semiconductor material stack 22 atop the recessed semiconductor substrate (i.e., the recessed semiconductor device layer 12C') in the at least one n-type doped region 16. As shown, the semiconductor material stack 22 comprises, from bottom to top, an amorphous semiconductor layer 24 and an n-type doped semiconductor layer 26.

The structure shown in FIG. 2 can be formed by first providing a block mask over one of the device regions, while leaving another device region exposed. The block mask can be formed by applying a block mask material atop the structure shown in FIG. 1, and then patterning the block mask material via lithography and etching. After providing the block mask, the exposed semiconductor substrate in one of device regions is recessed by etching which includes the use of an etchant that selectively removes semiconductor material, relative to the block mask. The etching that can be used to recess the exposed portion of the semiconductor substrate 12 includes wet etching, dry etching (i.e., one of reactive ion etching (RIE), plasma etching, ion beam etching and laser ablation) or a combination of wet and dry etching. When a wet etch is employed, the wet etch includes any chemical etchant, such as, for example, ammonium hydroxide that selectively etches the exposed surface of the semiconductor substrate 12. After recessing one of the device regions, either the p-type doped semiconductor layer 20 is formed in the at least one p-type device region 14 or the semiconductor material stack 22 is formed in the at least one n-type device region 16. Next, the block mask is removed and the steps of forming a block mask, recessing the exposed surface of the semiconductor substrate and forming either the p-type doped semiconductor layer 20 in the at least one p-type device region 14 or the semiconductor material stack 22 in the at least one n-type device region 16 is performed to the other device region that was not previously processed. The another block mask is then removed from the structure and, a planarization process can be employed, if needed, to provide the planar structure shown in FIG. 2.

The p-type doped semiconductor layer 20 that is formed in the at least one p-device region 14 comprises any semiconductor material which may be the same or different from that of the underlying semiconductor substrate. In one embodiment, the p-type doped semiconductor layer 20 comprises a semiconductor material having a different lattice constant than that of the underlying semiconductor substrate. In such an embodiment, the p-type doped semiconductor layer 20 can be used to impart a tensile stress on the underlying portion of the semiconductor substrate 12 in the at least one p-type device region 14. For example, and when the underlying semiconductor substrate 12 in the p-type device region 14 is comprised of silicon, the p-type doped semiconductor layer 20 can be comprised of p-type SiGe.

The term "p-type doped" when used in conjunction with p-type doped semiconductor layer 20 denotes an element from Group IIIA of the Periodic Table of Element, e.g., one of B, Al, Ga and In. In one embodiment, p-type doped semiconductor layer 20 is comprised of a boron doped semiconductor material such as, for example, boron doped SiGe.

In one embodiment, the concentration of the p-type dopant within the p-type doped semiconductor layer 20 is typically from 1E19 atoms/cm$^3$ to 7E20 atoms/cm$^3$. In another embodiment, the concentration of the p-type dopant within the p-type doped semiconductor layer 20 is typically from 3E20 atoms/cm$^3$ to 5E20 atoms/cm$^3$.

The p-type doped semiconductor layer 20 that is formed atop the exposed portion of the at least one p-type device region 14 can be formed by utilizing an in-situ doped epitaxial growth process. The in-situ doped epitaxial growth process used in forming the p-type doped semiconductor layer 20 ensures that the p-type doped semiconductor layer 20 is single crystalline and has the same crystallographic orientation as that of the exposed surface of the semiconductor substrate 12 in the at least one p-type device region 14. That is, the in-situ doped epitaxial growth process forms a p-type doped semiconductor layer 20 that is epitaxially aligned with the underlying semiconductor substrate 12. The in-situ doped epitaxial growth process employed in forming the p-type doped semiconductor layer 20 includes the use of at least one semiconductor precursor gas and a p-type dopant.

In one embodiment, the p-type doped semiconductor layer 20 has a thickness from 6 nm to 100 nm. In another embodiment, the p-type doped semiconductor layer 20 has a thickness from 15 nm to 25 nm. Other thicknesses above and/or below that aforementioned thickness ranges can also be employed in the present disclosure.

The semiconductor material stack 22 that is formed on the exposed surface of the at least one n-type device region 16 includes first forming an amorphous semiconductor layer 24 on the exposed surface of the semiconductor substrate 12 in the at least one n-type device region 16. The amorphous semiconductor layer 24 may comprise the same or different semiconductor material as that of the underlying exposed surface of the semiconductor substrate 12 in the at least one n-type device region 16. In one embodiment, both the amorphous semiconductor layer 24 and the underlying exposed surface of the semiconductor substrate 12 in the at least one n-type device region 16 are comprised of silicon. The term "amorphous" is used throughout the present application to denote a semiconductor material that lacks a well defined crystal structure.

The amorphous semiconductor layer 24 of semiconductor material stack 22 can be formed utilizing any chemical or physical growth processing including any semiconductor precursor source material. For example, selective epitaxy can be used to form the amorphous semiconductor layer 24. The amorphous semiconductor layer 24 is typically an intrinsic, i.e., non-doped, semiconductor layer.

In one embodiment, the amorphous semiconductor layer 24 has a thickness from 1 nm to 10 nm. In another embodiment, the amorphous semiconductor layer 24 has a thickness from 2 nm to 4 nm. Other thicknesses above and/or below that aforementioned thickness ranges can also be employed in the present disclosure.

Next, n-type doped semiconductor layer 26 is formed atop the amorphous semiconductor layer 24. The n-type doped semiconductor layer 26 that is formed in the at least one n-type device region 16 comprises any semiconductor material which may be the same or different from that of the underlying semiconductor substrate. In one embodiment, the n-type doped semiconductor layer 26 comprises a semiconductor material having a different lattice constant than that of the underlying semiconductor substrate. In such an embodiment, the n-type doped semiconductor layer 26 can used to impart a compressive stress on the underlying portion of the semiconductor substrate 12 in the at least one n-type device region 16. For example, and when the underlying semiconductor substrate 12 in the n-type device region 16 is comprised of silicon, the n-type doped semiconductor layer 26 can be comprised of n-type doped Si:C (carbon doped silicon). In another embodiment, and when the underlying semiconductor substrate 12 in the n-type device region 16 is comprised of silicon, the n-type doped semiconductor layer 26 can be comprised of n-type doped silicon.

The term "n-type doped" when used in conjunction with n-type doped semiconductor layer 26 denotes an element from Group VA of the Periodic Table of Element, e.g., one of P, As and Bi. In one embodiment, n-type doped semiconductor layer 26 is comprised of a phosphorus doped semiconductor material such as, for example, phosphorus doped Si or phosphorus doped Si:C.

In one embodiment, the concentration of the n-type dopant within the n-type doped semiconductor layer 26 is typically from 1E19 atoms/cm$^3$ to 7E20 atoms/cm$^3$. In another embodiment, the concentration of the n-type dopant within the n-type doped semiconductor layer 26 is typically from 3E20 atoms/cm$^3$ to 5E20 atoms/cm$^3$.

In one embodiment, the n-type dopant semiconductor layer 26 that is formed atop the amorphous semiconductor layer 24 can be amorphous. In another embodiment, the n-type dopant semiconductor layer 26 that is formed atop the amorphous semiconductor layer 24 can be polycrystalline. A polycrystalline semiconductor material is a semiconductor material that is composed of many crystallites of varying size and orientation.

The n-type dopant semiconductor layer 26 can be formed utilizing any chemical or physical growth process including any semiconductor precursor source material and any n-type dopant source. For example, selective epitaxial growth of P doped SiC can be used to form the n-type dopant semiconductor layer 26.

In one embodiment, the n-type dopant semiconductor layer 26 has a thickness from 6 nm to 100 nm. In another embodiment, the n-type dopant semiconductor layer 26 has a thickness from 15 nm to 25 nm. Other thicknesses above and/or below that aforementioned thickness ranges can also be employed in the present disclosure.

Although FIGS. 1-2 illustrate the formation of the isolation region 18 prior to forming the p-type doped semiconductor layer 20 in the at least one p-type device region 14 and forming the semiconductor material stack 22 in the at least one n-type device region 16, the present application also contemplates an alternative embodiment in which the p-type doped semiconductor layer 20 and the semiconductor material stack 22 are formed on non-recessed portions of the semiconductor substrate prior to forming the isolation region 18.

Figure 3:
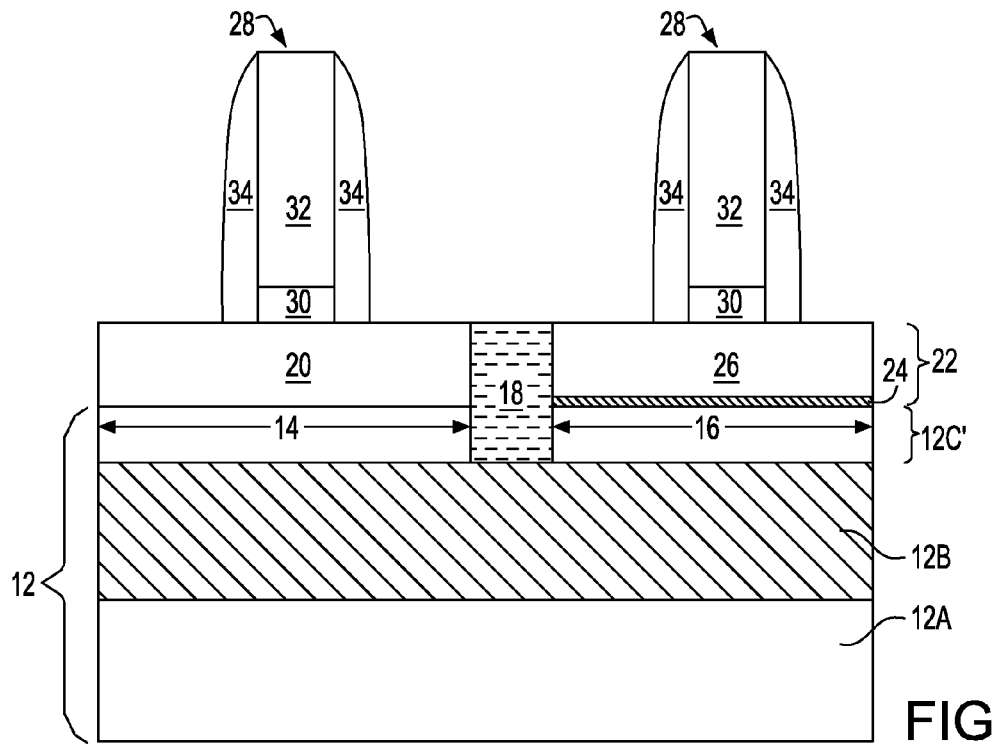
FIG. 3 is a pictorial representation (through a cross sectional view) illustrating the structure of FIG. 2 after forming a sacrificial gate region in both the at least one p-type device region and the at least one n-type device region and after forming a spacer on the sidewalls of each sacrificial gate region.

Referring now to FIG. 3, there is illustrated the structure of FIG. 2 after forming a sacrificial (i.e., disposable) gate region 28 in both the at least one p-type device region 14 and the at least one n-type device region 16 and after forming a spacer 34 on the sidewalls of each sacrificial gate region 28. As shown, the sacrificial gate region 28 includes, from bottom to top, a sacrificial dielectric layer 30 and a sacrificial gate material layer 32.

The sacrificial dielectric layer 30 comprises any dielectric material including, for example, a semiconductor oxide such as silicon oxide, silicon nitride, and silicon oxynitride. The sacrificial dielectric layer 30 can be formed as a blanket layer over exposed upper surfaces of the p-type doped semiconductor layer 20 and the semiconductor material stack 22 utilizing any conventional deposition process including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), and other like deposition processes. In some embodiments of the present disclosure, the sacrificial dielectric layer 30 is formed utilizing a thermal growth process including, for example, oxidation and nitridation. The thickness of the sacrificial dielectric layer 30 may vary depending on the type of dielectric material employed as well as the technique that was used in forming the same. Typically, and by way of an example, the sacrificial dielectric layer 30 has a thickness from 1 nm to 5 nm. More typically, the sacrificial dielectric layer 30 has a thickness from 1 nm to 3 nm.

The sacrificial gate material layer 32, which is located on an upper surface of the sacrificial dielectric layer 30, includes any material (doped or non-doped) that can be subsequently removed selective to dielectric material. In one embodiment, the sacrificial gate material layer 32 can be composed of a semiconductor material such as, for example, polysilicon. The sacrificial gate material layer 32 can be formed utilizing any deposition process including, for example, chemical vapor deposition (CVD), plasma enhanced chemical vapor deposition (PECVD), evaporation, physical vapor deposition (PVD), sputtering, chemical solution deposition, and atomic layer deposition (ALD). When a doped sacrificial gate material layer 32 is employed, the dopant can be introduced in-situ during the deposition process. Alternatively, the dopant can be introduced following the deposition by any suitable doping technique such as, for example, ion implantation and gas phase doping. The thickness of the sacrificial gate material layer 32 may vary depending on the type of sacrificial material employed as well as the technique that was used in forming the same. Typically, and by way of an example, the sacrificial gate material layer 32 has a thickness from 20 nm to 100 nm. More typically, the sacrificial gate material layer 32 has a thickness from 30 nm to 60 nm.

After forming the blanket layers of sacrificial gate material layer 32 and sacrificial gate dielectric layer 30, layers 32 and 30 are patterning forming at least one sacrificial gate region 28 atop the p-type doped semiconductor layer 20 and the semiconductor material stack 22. The patterning of blanket layers 32 and 30 includes lithography and etching. The lithography includes forming a photoresist material (not shown) on an upper surface of the blanket layer of sacrificial gate material layer 32, exposing the photoresist to a desired pattern of radiation and developing the exposed resist using a conventional resist developer. The etching step can include a dry etching process, a wet etching process or a combination thereof. When a dry etching process is employed, the dry etching process can include one of reactive ion etching, ion beam etching, plasma etching and laser ablation. When a wet etching process is employed, a chemical etchant that is selective to the underlying materials of layers 32 and 30 is employed. The patterned resist that is formed can remain atop the blanket layer of sacrificial gate material layer 32 during the etching process. Alternatively, the patterned resist that is formed can be removed after transferring the pattern into at least the blanket layer of sacrificial gate material layer 32. The removal of the patterned resist can be achieved using any conventional resist stripping process such as, for example, ashing.

After forming the sacrificial gate regions 28 in each device region, a spacer 34 is formed on the sidewalls of each sacrificial gate region 28. The spacer 34 that is formed can be comprised of a dielectric material such as, for example, silicon oxide, silicon nitride or silicon oxynitride. In one embodiment, the spacer 34 is comprised of silicon nitride. In some embodiments, the spacer 34 may include a multilayered stack of such dielectric materials. The spacer 34 can be formed by deposition of a conformal dielectric material layer, followed by anisotropic etching.

Figure 4:
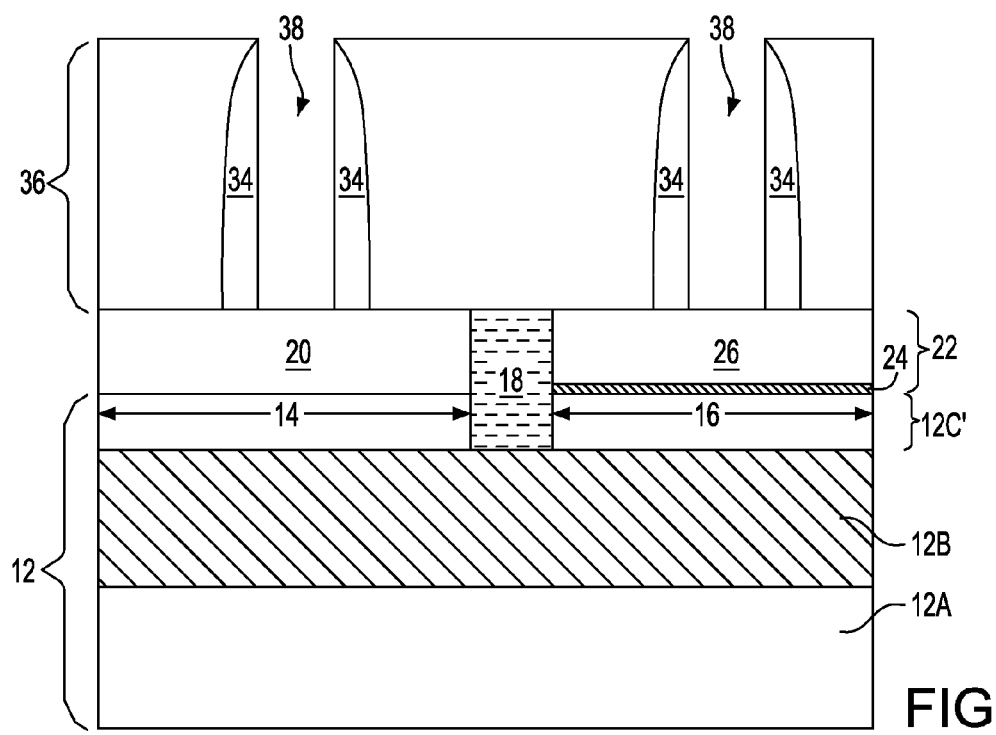
FIG. 4 is a pictorial presentation (through a cross sectional view) illustrating the structure of FIG. 3 after forming a planarizing dielectric material and removing the sacrificial gate region from both the at least one p-type device region and the at least one n-type device region to form an opening in the planarizing dielectric material in both device regions.

Referring to FIG. 4, there is illustrated the structure of FIG. 3 after forming a planarizing dielectric material 36 and removing the sacrificial gate region 28 from both the at least one p-type device region 14 and the at least one n-type device region 16 to form an opening 38 in the planarizing dielectric material 36 in both device regions.

The planarizing dielectric material 36 can be composed of any dielectric material such as, for example, a doped or undoped silicon glass, silicon oxide, and silicon nitride, that can be easily planarized. The planarizing dielectric material 36 can be formed utilizing any conventional deposition process including, for example, chemical vapor deposition (CVD), plasma enhanced chemical vapor deposition (PCVD), and physical vapor deposition (PVD). The height, e.g., vertical thickness, of the planarizing dielectric material 36 that is formed is greater than the overall vertical thickness of each sacrificial gate region 28. Typically, and by way of an example, the vertical thickness of the planarizing dielectric material 36 is from 50 nm to 300 nm. More typically, the vertical thickness of the planarized dielectric material 36 is from 100 nm to 200 nm.

After depositing the planarizing dielectric material 36, the planarizing dielectric material 36 is subjected to a planarization process such as, for example, chemical mechanical polishing. The planarization process stops atop an upper surface of the sacrificial gate region 28. After planarization, the upper surface of the planarizing dielectric material 36 is substantially coplanar with an upper surface of the sacrificial gate region 28.

Each opening 38 can be formed by removing exposed portions of the sacrificial gate region 28 utilizing an etching step. The etching step includes dry etching or wet etching and it stops on an upper surface of the p-type doped semiconductor layer 20 in the at least one p-type device region 14 and atop the n-type doped semiconductor layer 26 in the at least one n-type device region 16. In one embodiment, reactive ion etching is employed in forming each opening 38.

Figure 5:
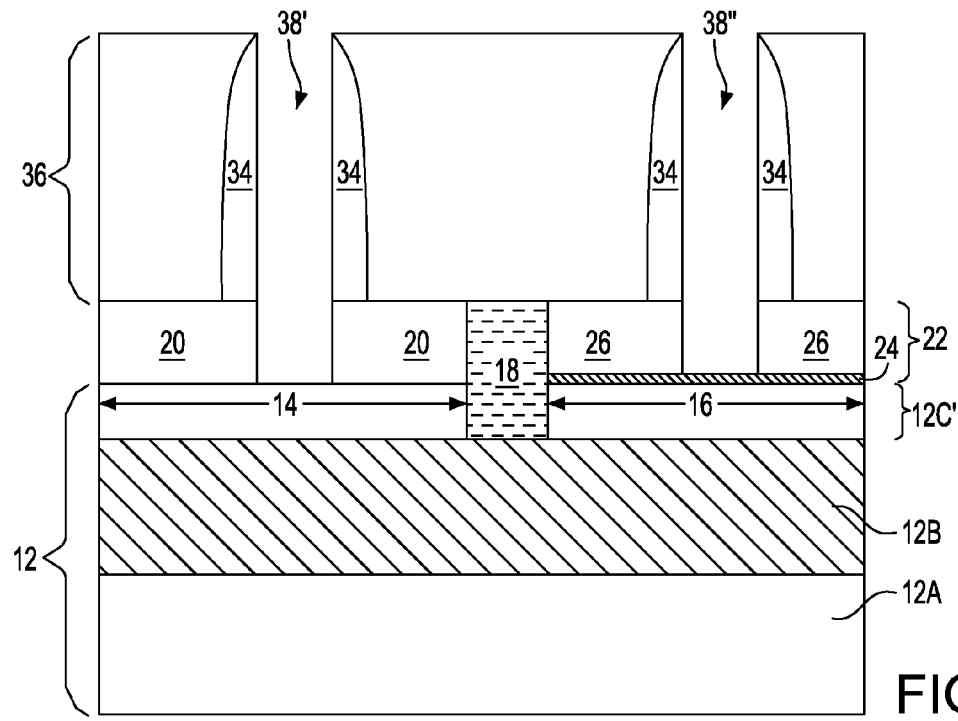
FIG. 5 is a pictorial representation (through a cross sectional view) illustrating the structure of FIG. 4 after extending the opening through the p-type doped semiconductor layer in the at least one p-type device region, stopping atop one an upper surface of the semiconductor substrate, and after extending the opening in the at least one p-type device region, stopping on an upper surface of the amorphous semiconductor layer.

Referring now to FIG. 5, there is illustrated the structure of FIG. 4 after extending each opening 38 in both device regions through the underlying p-doped semiconductor layer 20 and the n-doped semiconductor layer 26. Specifically, FIG. 5 shows extended opening 38' in the p-type device region 14 that stops atop the topmost surface of semiconductor substrate 12 and extended opening 38" that stops atop the amorphous semiconductor layer 24. The presence of the amorphous semiconductor layer 24 in the n-type device region 16 acts as an etch stop layer preventing any removal of the underlying crystalline surface of the semiconductor substrate 12.

The order of extending each opening 38 may vary. In one embodiment, the opening in the at least one p-type device region 14 is extended first, followed by extending the opening in the at least one n-type device region 16. In another embodiment, the opening in the at least one n-type device region 16 is extended first, followed by extending the opening in the at least one p-type device region 14. In either embodiment, a block mask can be formed atop one of the device regions, while the opening in the other device region is being extended.

The extended opening 38' in the at least one p-type device region 14 can be formed utilizing an etchant that is selective in removing the exposed portion of the p-type doped semiconductor layer 20, stopping atop the semiconductor substrate 12. In one embodiment, Tetra-ethyl Ammonium Hydroxide (TEAH) can be used to form the extended opening 38' in the at least one p-type device region 14. The extended opening 38" in that at least one n-type device region 16 can be formed utilizing an etchant that is selective in removing the exposed portion of the n-type doped semiconductor layer 26, stopping atop the amorphous semiconductor layer 24. In one embodiment, TEAH and dry etch of crystalline Si can be used to form the extended opening 38" in the at least one n-type device region 14.

Figure 6:
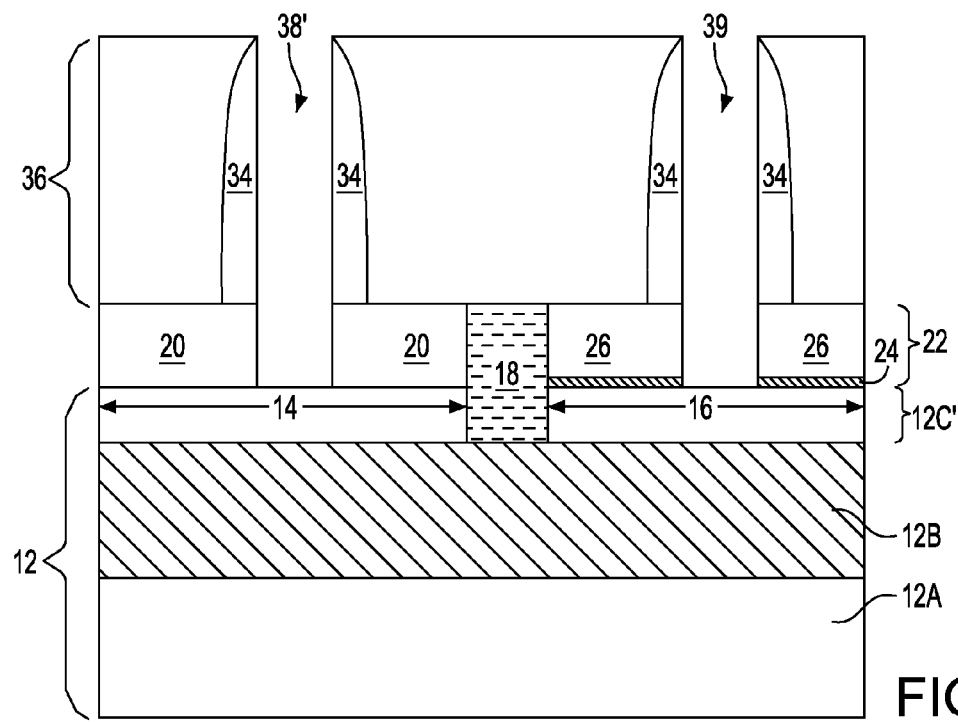
FIG. 6 is a pictorial representation (through a cross sectional view) illustrating the structure of FIG. 5 after removing an exposed portion of the amorphous semiconductor layer at the bottom of the extended opening formed in the at least one n-type device region.

Referring to FIG. 6, there is illustrated the structure of FIG. 5 after removing an exposed portion of the amorphous semiconductor layer 24 at the bottom of the extended opening 38" formed in the at least one n-type device region 16 forming a second extended opening 39 in the at least one n-type device region 16. The second extended opening 39 in the at least one n-type device region 16 can be formed utilizing an etchant that selectively removes the exposed portion of the amorphous semiconductor layer 24, stopping atop the semiconductor substrate 12. In one embodiment, dry etch of amorphous Si can be used in forming the second extended opening 39.

Figure 7:
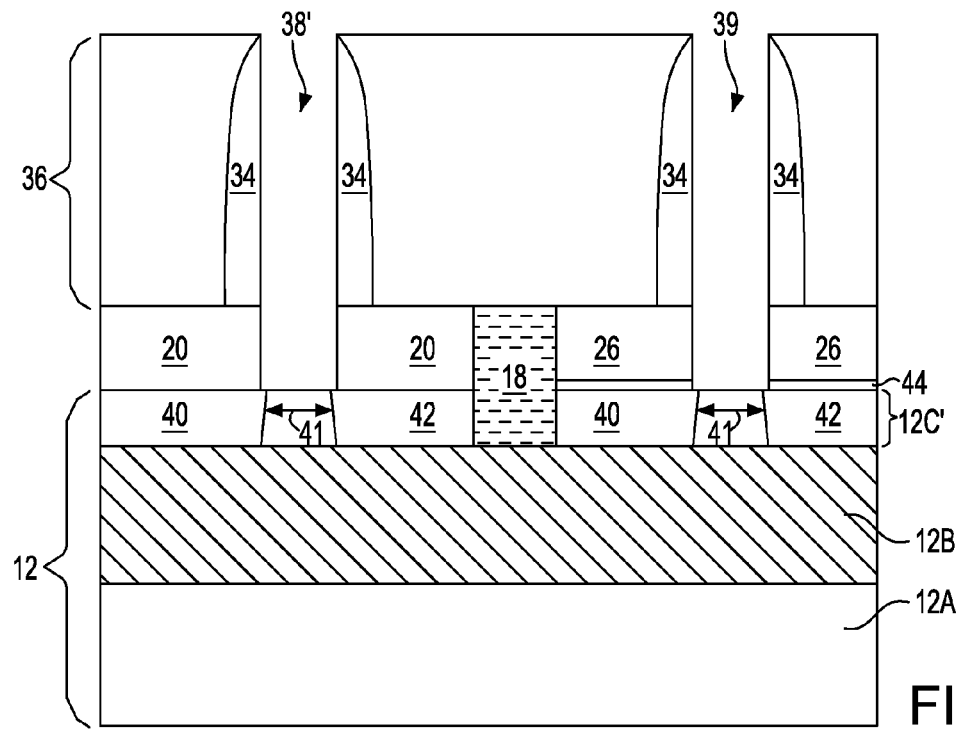
FIG. 7 is a pictorial representation (through a cross sectional view) illustrating the structure of FIG. 6 after performing an anneal.

Referring to FIG. 7, there is depicted the structure of FIG. 6 after performing an anneal that forms a source region 40 and a drain region 42 within an upper portion of the semiconductor substrate 12 in both the at least one p-type device region 14 and the at least one n-type device region 16, while crystallizing remaining portions of the amorphous semiconductor layer 24 in the at least one n-type device region 16. The recrystallized portions of the amorphous semiconductor layer 24 are now labeled as element 44 in the drawings. Element 41 represents a device channel that is present in an upper portion of the semiconductor substrate 12 between the source region 40 and the drain region 42. During the anneal, the n-type doped semiconductor layer 26 also undergoes recrystallization forming a single crystalline material layer.

The source region 40 and the drain region 42 formed in the p-type device region 14 during the anneal are provided by outdiffusing p-type dopant from the remaining overlying portions of the p-type doped semiconductor layer 20. The source region 40 and the drain region 42 formed in the n-type device region 16 are provided by outdiffusing n-type dopant from the remaining overlying portions of the n-type doped semiconductor layer 26. Diffusion of n-type dopant within the recrystallization portions of the amorphous semiconductor layer also occurs.

In the present disclosure, the remaining portions of the p-type doped semiconductor layer 20 serve as the raised source/drain regions of a pFET device, while the remaining portions of the n-type doped semiconductor layer 26 and the recrystallized portions of the amorphous semiconductor layer (i.e., layer 44) serve as the raised source/drain regions of an nFET device.

The anneal is typically performed at a temperature from 900° C. to 1085° C., with a temperature from 1000° C. to 1040° C. being more typical.

The source region 40 and the drain region 42 that are formed in the p-type device region 14 typically have a p-type dopant concentration from 1E19 atoms/cm$^3$ to 7E20 atoms/cm$^3$, with a p-type dopant concentration from 3E20 atoms/cm$^3$ to 5E20 atoms/cm$^3$ being more typical. After the outdiffusion process, the remaining portions of the p-type doped semiconductor layer 20 typically have a p-type dopant concentration from 1E19 atoms/cm$^3$ to 7E20 atoms/cm$^3$, with a p-type dopant concentration from 3E20 atoms/cm$^3$ to 5E20 atoms/cm$^3$ being more typical.

The source region 40 and the drain region 42 that are formed in the n-type device region 16 typically have an n-type dopant concentration from 1E19 atoms/cm$^3$ to 7E20 atoms/cm$^3$, with an n-type dopant concentration from 3E20 atoms/cm$^3$ to 5E20 atoms/cm$^3$ being more typical. After the outdiffusion process, the remaining portions of the n-type doped semiconductor layer 26 typically have a p-type dopant concentration from 1E19 atoms/cm$^3$ to 7E20 atoms/cm$^3$, with a p-type dopant concentration from 3E20 atoms/cm$^3$ to 5E20 atoms/cm$^3$ being more typical.

As such, the junction between the raised source/drain regions and the underlying source/drain regions in the disclosed structure is sharp. By "sharp" it is meant a box shaped profile of dopant concentration with no dopant diffusivity enhancement due to conventional Si interstitial defects present from implant damage.

Figure 8:
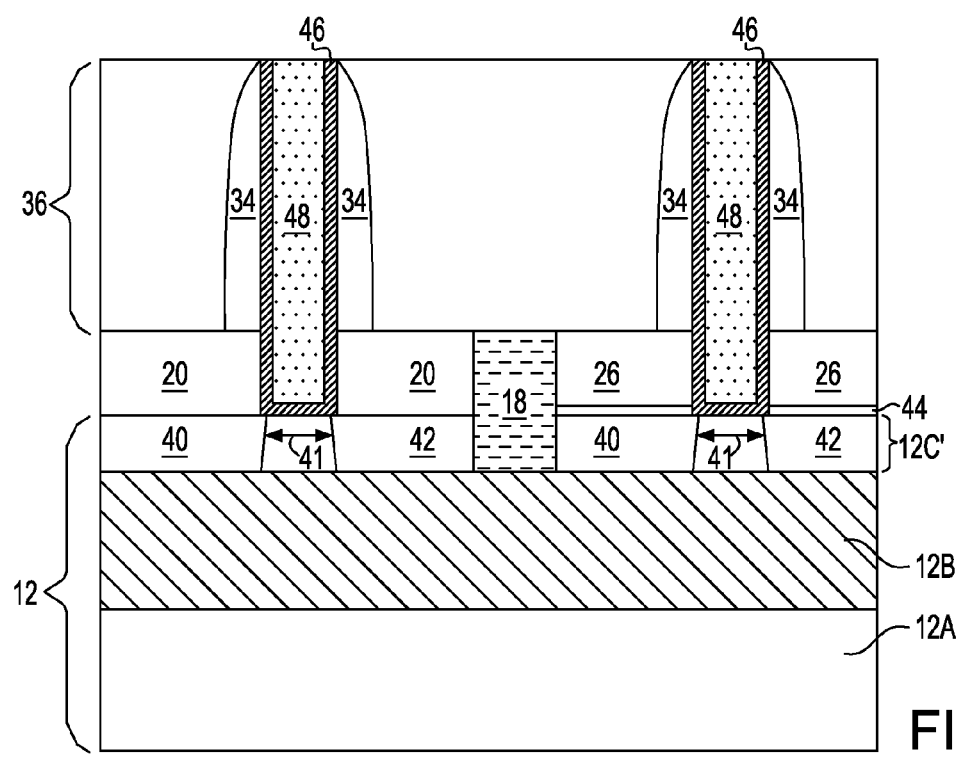
FIG. 8 is a pictorial representation (through a cross sectional view) illustrating the structure of FIG. 7 after formation of a high k gate dielectric and a metal gate in the extended openings in both device regions.

Referring to FIG. 8, there is illustrated the structure of FIG. 7 after formation of a high k gate dielectric 46, which is U-shaped, and a metal gate 48 in the extended openings 38' and 39 in both device regions. It is observed that in FIG. 8 a portion of the raised source/drain regions is located beneath the spacer 34 and that an edge portion of the raised source/drain regions is in contact with a portion of the high k gate dielectric 46. Also, and as shown in FIG. 8, the high k gate dielectric 46 is contiguously present on sidewall surfaces and a bottom surface of the metal gate 48.

The high k gate dielectric 46 can be comprised of a dielectric material that has a dielectric constant, as measured in a vacuum, of greater than 4.0, typically greater than 8.0. In one embodiment, the high k gate dielectric 46 can include a dielectric metal oxide, which is a high k material containing a metal and oxygen. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the high k gate dielectric 46, as measured at horizontal portions, can be from 0.9 nm to 6 nm, and preferably from 1.0 nm to 3 nm. The high k gate dielectric 46 may have an effective oxide thickness on the order of or less than 1 nm.

In some embodiments, the high k gate dielectric 46 formed in both device regions is comprised of the same dielectric material. In another embodiment, the gate dielectric material in the at least one p-type device region 14 is different from the gate dielectric material in the at least one n-type device region 16. Different gate dielectric layers can be achieved utilizing block mask technology.

The metal gate 48 includes a conductive metal such as, but not limited to Al, W, Cu, Pt, Ag, Au, Ru, Ir, Rh and Re, alloys of a conductive metal, e.g., Al—Cu, silicides of a conductive metal, e.g., W silicide, and Pt silicide, nitrides of a conductive metal, e.g., AlN, and combinations and multilayers thereof. The metal gate 48 can be formed utilizing a conventional deposition process such as, for example, atomic layer deposition (ALD), chemical vapor deposition (CVD), metalorganic chemical vapor deposition (MOCVD), molecular beam epitaxy (MBE), physical vapor deposition, sputtering, plating, evaporation, ion beam deposition, electron beam deposition, laser assisted deposition, and chemical solution deposition.

In some embodiments, the metal gate 48 formed in both device regions is comprised of the same conductive metal. In another embodiment, the conductive metal in the at least one p-type device region 14 is different from the conductive metal in the at least one n-type device region 16. Different metal gate conductors can be achieved utilizing block mask technology.

Following the formation of the high k gate dielectric 46 and the metal gate 48, the structure is subjected to planarization such as, for example, chemical mechanical planarization and/or grinding to provide the structure shown, for example in FIG. 8.

Figure 9:
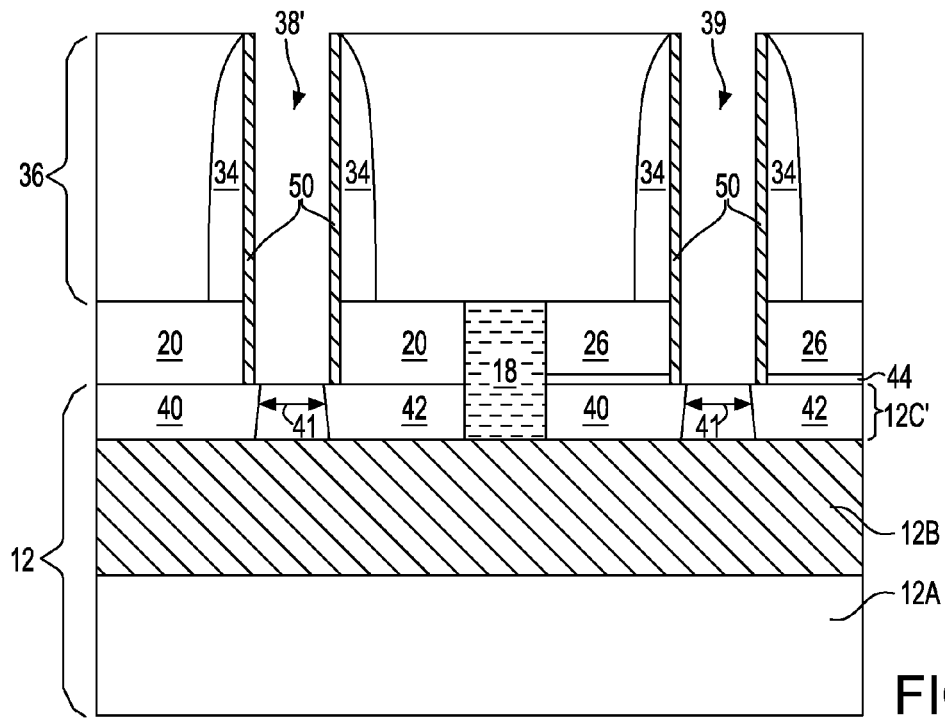
FIG. 9 is a pictorial representation (through a cross sectional view) illustrating the structure of FIG. 7 after forming an inner spacer within the extended openings in both device regions.

Referring now to FIG. 9, there is illustrated the structure of FIG. 7 after forming an inner spacer 50 within the extended openings 38" and 39 in both device regions. The inner spacer 50 can comprise the same or different, typically different, dielectric material as spacer 34. The inner spacer 50 can be formed utilizing the same process as mentioned above for forming spacer 34. The presence of the inner spacer 50 reduces parasitic capacitance between the metal gate 48 and the source region 42 and the drain region 44 in each of the device regions.

Figure 10:
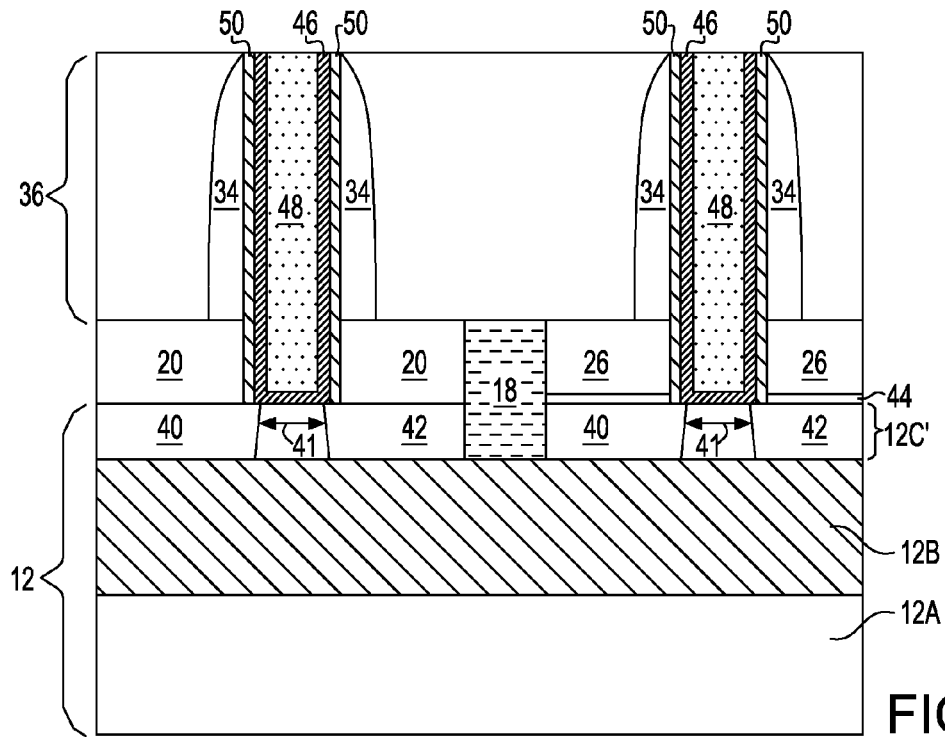
FIG. 10 is a pictorial representation (through a cross sectional view) illustrating the structure of FIG. 9 after formation of a high k gate dielectric and a metal gate in the extended openings in both device regions.

Referring now to FIG. 10, there is illustrated the structure of FIG. 9 after formation of a high k gate dielectric 46 and a metal gate 48 in the extended openings in both device regions The materials, and processing for forming high k gate dielectric material 46 and the metal gate 48 are the same as that mentioned above. It is observed that in FIG. 10 the raised source/drain regions are located beneath the spacer 34 and that an edge portion of the raised source/drain regions is separated from the high k gate dielectric 46 by the presence of the inner spacer 50.

Each structure shown in FIGS. 8 and 10 comprises a semiconductor substrate 12 having a source region 40 and a drain region 42 that are separated by a channel 41 located within at least one device region (i.e., the at least one p-type device region 14 and the at least one n-type device region 16). A high k gate dielectric 46 and a metal gate 48 are located atop the channel 41. The high k gate dielectric 46 is contiguously present on sidewall surfaces and a bottom surface of the metal gate 48. A raised source region is located atop the source region 40 and a raised drain region is located atop the drain region 42; the raised source/drain regions in the p-type device region 14 are the remaining portions of the p-type doped semiconductor layer 20, while the raised source/drain regions in the n-type device region 16 are the remaining portions of the n-type doped semiconductor layer 26 and the recrystallized layer 44. A spacer 34 is located atop a portion of the raised source region and atop a portion of the raised drain region; spacer 34 separates portions of the high k gate dielectric 46 from the adjacent planarizing dielectric material 36. The portion of the raised source region and the portion of the raised drain region underneath the spacer 34 are laterally adjacent a vertical portion of the high k gate dielectric 46. A planarizing dielectric material 36 is located atop the raised source region and the raised drain region. The planarizing dielectric material 36 has an upper surface that is coplanar with an upper surface of the metal gate 48.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor structure comprising:
    providing a structure including a semiconductor substrate having at least one device region located therein, a doped semiconductor layer located on an upper surface of the semiconductor substrate in the at least one device region, and an isolation region in contact with a sidewall surface of said doped semiconductor layer, wherein an uppermost surface of said doped semiconductor layer is coplanar with an uppermost surface of said isolation region;
    forming a sacrificial gate region having a spacer located on sidewalls thereof on an upper surface of the doped semiconductor layer;
    forming a planarizing dielectric material atop the doped semiconductor layer and adjoining the sacrificial gate region including the spacer;
    removing the sacrificial gate region to form an opening that exposes a portion of the doped semiconductor layer;
    extending the opening through a portion of the doped semiconductor layer to an upper surface of the semiconductor substrate;
    performing an anneal that causes outdiffusion of dopant from remaining portions of the doped semiconductor layer forming a source region and a drain region in portions of the semiconductor substrate that are located beneath the remaining portions of the doped semiconductor layer; and
    forming a high k gate dielectric and a metal gate into the extended opening.

2. The method of claim 1, wherein the at least one device region is a p-type device region and the doped semiconductor layer is a p-type doped semiconductor layer.

3. The method of claim 2, wherein said p-type doped semiconductor layer comprises a semiconductor material having a different lattice constant than the underlying semiconductor substrate and is formed by an in-situ doped epitaxial growth process.

4. The method of claim 1, wherein the at least one device region is an n-type device region and the doped semiconductor layer is an n-type doped semiconductor layer having a lattice constant different from the underlying semiconductor substrate and is formed by a chemical or physical growth process, and wherein an amorphous semiconductor layer is positioned between the semiconductor substrate and the n-type doped semiconductor layer.

5. The method of claim 4, wherein said anneal recrystallizes said amorphous semiconductor layer.

6. The method of claim 1, wherein said remaining portions of the doped semiconductor layer form a raised source region and a raised drain region, and wherein a portion of the semiconductor substrate between the source region and the drain region forms a channel.

7. The method of claim 6, wherein a portion of each of said raised source region and said raised drain region is located beneath said spacer and is in direct contact with a portion of the high k gate dielectric.

8. The method of claim 6, further comprising forming an inner spacer within the extended opening prior to forming said high k gate dielectric and said metal gate, and wherein a portion of each of said raised source region and said raised drain region is located beneath said spacer and is spaced apart from the high k gate dielectric by said inner spacer.

9. The method of claim 1, wherein said annealing is performed at a temperature from 1000° C. to 1040° C.

10. A method of forming a complementary metal oxide semiconductor (CMOS) structure comprising:
providing a structure including a semiconductor substrate having at least one p-type device region and at least one n-type device region, a p-type doped semiconductor layer located on an upper surface of the semiconductor substrate in the at least one p-type device region, a semiconductor stack comprising, from bottom to top, an amorphous semiconductor layer and an n-type doped semiconductor layer in the at least one n-type device region, and an isolation region extending to a surface of the semiconductor substrate and separating the p-type doped semiconductor layer in the at least one p-type device region from the semiconductor material stack in the at least one n-type device region, wherein an uppermost surface of the n-type doped semiconductor layer and an uppermost surface of the p-type doped semiconductor are both coplanar to an uppermost surface of said isolation region;
forming a sacrificial gate region having a spacer located on sidewalls thereof on an upper surface of each of the p-type doped semiconductor layer and the n-type doped semiconductor layer;
forming a planarizing dielectric material atop the p-type doped semiconductor layer and the n-type doped semiconductor layer and adjoining each sacrificial gate region including said spacer;
removing the sacrificial gate region from the at least one p-type device region and the at least one n-type device region to form an opening that exposes a portion of the p-type doped semiconductor layer and another opening that exposes a portion of the n-type doped semiconductor layer;
extending each opening through a portion of the p-doped and n-doped semiconductor layers to an upper surface of the semiconductor substrate;
performing an anneal that causes outdiffusion of dopant from remaining portions of the p-type doped semiconductor layer forming a source region and a drain region in portions of the semiconductor substrate that are located beneath the remaining portions of the p-type doped semiconductor layer and outdiffusion of dopant from remaining portions of the n-type doped semiconductor layer forming another source region and another drain region in portions of the semiconductor substrate that are located beneath the remaining portions of the n-type doped semiconductor layer; and
forming a high k gate dielectric and a metal gate into each of the extended openings.

11. The method of claim 10, wherein said p-type doped semiconductor layer comprises a semiconductor material having a different lattice constant than the underlying semiconductor substrate and is formed by an in-situ doped epitaxial growth process.

12. The method of claim 10, wherein said n-type doped semiconductor layer comprises a semiconductor material having a lattice constant different from the underlying semiconductor substrate and is formed by a chemical or physical growth process.

13. The method of claim 10, wherein said anneal recrystallizes said amorphous semiconductor layer.

14. The method of claim 10, wherein said remaining portions of the p-type doped semiconductor layer form a raised source region and a raised drain region in the at least one p-type device region, wherein a portion of the semiconductor substrate between the source region and the drain region forms a channel in the at least one p-type device region, and wherein said remaining portions of the n-type doped semiconductor layer form another raised source region and another raised drain region in the at least one n-type device region, wherein a portion of the semiconductor substrate between the another source region and the another drain region forms another channel in the at least one n-type device region.

15. The method of claim 14, wherein a portion of each of said raised source region and said raised drain region in said at least one p-type device region is located beneath said spacer and is in direct contact with a portion of the high k gate dielectric, and wherein a portion of each of said another raised source region and said another raised drain region in said at least one n-type device region is located beneath said spacer and is in direct contact with a portion of the high k gate dielectric.

16. The method of claim 10, further comprising forming an inner spacer within each extended opening prior to forming said high k gate dielectric and said metal gate, and wherein a portion of each of said raised source region and said raised drain region in said at least one p-type device region is located beneath said spacer and is spaced apart from the high k gate dielectric by said inner spacer, and wherein a portion of each of said another raised source region and said another raised drain region in said at least one n-type device region is located beneath said spacer and is spaced apart from the high k gate dielectric by said inner spacer.

17. The method of claim 10, wherein said annealing is performed at a temperature from 1000° C. to 1040° C.

18. A semiconductor structure comprising:
a semiconductor substrate having a source region and a drain region that are separated by a channel located within at least one device region;
a high k gate dielectric and a metal gate located atop the channel, wherein said high k gate dielectric is contiguously present on sidewall surfaces and a bottom surface of said metal gate;
a raised source region located atop the source region and a raised drain region located atop the drain region;
a spacer located directly on an uppermost surface portion of the raised source region and directly on an uppermost surface portion of the raised drain region, wherein said uppermost surface portion of the raised source region and said uppermost surface portion of the raised drain region underneath the spacer are laterally adjacent a lower vertical portion of the high k gate dielectric; and
a planarizing dielectric material located atop the raised source region and the raised drain region, said planarizing dielectric material having an upper surface that is coplanar with an upper surface of the metal gate.

19. The semiconductor structure of claim 18, wherein the at least one device region is a p-type device region and the doped semiconductor layer is a p-type doped semiconductor layer.

20. The semiconductor structure of claim 19, wherein said p-type doped semiconductor layer comprises a semiconductor material having a different lattice constant than the underlying semiconductor substrate, yet has a same crystal orientation as that of the underlying semiconductor substrate.

21. The semiconductor structure of claim 18, wherein the at least one device region is an n-type device region and the doped semiconductor layer is an n-type doped semiconductor layer having a lattice constant different from the underlying semiconductor substrate.

22. The semiconductor structure of claim 18, wherein an inner spacer is present on an outer surface of the high k gate dielectric.

23. The semiconductor structure of claim 18, wherein said at least one device region comprises a p-type device region and an n-type device region that are spaced apart by an isolation region, wherein the doped semiconductor layer in the p-type device region is a p-type doped semiconductor layer and wherein the doped semiconductor layer in the n-type device region is an n-type doped semiconductor layer.

24. The semiconductor structure of claim 23, wherein said p-type doped semiconductor layer comprises a semiconductor material having a different lattice constant than the underlying semiconductor substrate in the p-type device region, yet has a same crystal orientation as that of the underlying semiconductor substrate in the p-type device region, and wherein said n-type doped semiconductor layer comprises another semiconductor material having a lattice constant different from the underlying semiconductor substrate in the n-type device region.

25. The semiconductor structure of claim 24, wherein an inner spacer is present on an outer surface of the high k gate dielectric in p-type device region and the n-type device region.

* * * * *